(12) United States Patent
Sasaki

(10) Patent No.: US 6,333,270 B1
(45) Date of Patent: *Dec. 25, 2001

(54) ETCHING GAS USED FOR PLASMA-ENHANCED ETCHING OF VANADIUM OXIDE FILM AND METHOD OF PLASMA-ENHANCED ETCHING OF VANADIUM OXIDE FILM

(75) Inventor: Tokuhito Sasaki, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/313,634

(22) Filed: May 18, 1999

(30) Foreign Application Priority Data

May 18, 1998 (JP) .................................... 10-135053

(51) Int. Cl.[7] .................................... H01L 21/302
(52) U.S. Cl. .................... 438/706; 438/720; 438/722; 252/79.1
(58) Field of Search .................... 438/720, 722, 438/706; 252/79.1

(56) References Cited

U.S. PATENT DOCUMENTS 4,390,394 * 6/1983 Mathuni et al. ............... 438/717
4,659,426 * 4/1987 Fuller et al. .................. 438/719

FOREIGN PATENT DOCUMENTS 58-42368   3/1983   (JP) .
64-64273   3/1989   (JP) .
8083933  * 3/1996   (JP) ......................... H01L/39/24

OTHER PUBLICATIONS

NEC Corp., Superconductive IC Mfg. Method—by Performing Etching Using Reactant Ion Milling Process Thereby Processing Vanadium Alloy Layer into Resistance Layer, English Abtract of JP 08083933, Mar. 1996.*

H. Wada et al., "Fabrication Process for 256 × 256 Bolometer–Type Uncooled Infrared Detector", Society of Photo-–optical Instrumentation Engineers Proceeding, vol. 3224, pp. 40–51 with Abstract.

H Buhay et al. "Summary Abstract: Reactive ion etching of vanadium diozide thin films", Journal of Vacuum Science and Technology, vol. A4, (1986), pp. 440–442.

* cited by examiner

Primary Examiner—Benjamin L. Utech
Assistant Examiner—Lynette T. Umez-Eronini
(74) Attorney, Agent, or Firm—Sughrue Mion, PLLC

(57) ABSTRACT

There is provided a method of carrying out plasma-enhanced etching of a vanadium oxide film, including the steps of (a) depositing one of a resist film and an insulating film on a vanadium oxide film, (b) patterning the one of a resist film and an insulating film to thereby form a mask, and (c) carrying out plasma-enhanced etching of a vanadium oxide film through the use of an etching gas containing a fluoride gas at a volume ratio of 10% or greater, which fluoride having fluorine (F) atoms by six or greater. The method raises an etching ratio of a vanadium oxide film to an underlying insulating layer, resulting in that it is possible to prevent the underlying insulating layer from being etched together, when the vanadium oxide film is etched.

12 Claims, 3 Drawing Sheets

ETCHING GAS USED FOR PLASMA-ENHANCED ETCHING OF VANADIUM OXIDE FILM AND METHOD OF PLASMA-ENHANCED ETCHING OF VANADIUM OXIDE FILM

BACKGROUND OF THE INVENTION

1. Field of the Invention

The invention relates to a method of carrying out plasma-enhanced etching of a vanadium oxide film, and more particularly to such a method in which an etching ratio of a vanadium oxide film to an underlying insulating layer is enhanced. The invention relates also to an etching gas to be used in such a method.

2. Description of the Related Art

Vanadium oxide is known as a material having a resistance which varies much in dependence on a temperature, and is widely used by virtue of such characteristic. For instance, a temperature detecting film and an infrared ray detecting film are composed of vanadium oxide.

For instance, Japanese Unexamined Patent Publication No. 58-42368 has suggested a solid-state image sensor including a photo-absorptive layer composed of vanadium oxide.

In fabrication of a temperature detecting film from vanadium oxide, a vanadium oxide film having a thickness of about 50 to about 200 nm is first deposited, and then, the thus deposited vanadium oxide film is treated for defining a region only in which a temperature is varied, in order to efficiently cause temperature fluctuation.

A vanadium oxide film has been conventionally treated by either ion milling in which a vanadium oxide film is physically etched by ion bombardment, or plasma-enhanced etching in which vanadium oxide is made to chemically react with highly volatile material to thereby evaporate vanadium oxide into a desired pattern. For instance, the ion milling is described Japanese Unexamined Patent Publication No. 64-64273, and also in Wada et al., Society of Photo-optical Instrumentation Engineers Proceeding, 1997, Vol. 3224, pp. 46, line 5, and the plasma-enhanced etching is described in Buhey et al., Journal of Vacuum Science and Technology, 1986, Vol. A4, pp. 440–442.

However, the ion milling is accompanied with a problem as follows.

FIG. 1 is a cross-sectional view of a semiconductor device including a semiconductor substrate 1, wiring layers 2 formed in the semiconductor substrate 1, a first insulating layer 3 formed on the semiconductor substrate 1, a vanadium oxide film 4 formed on the first insulating layer 3, and a second insulating layer 5 formed on the vanadium oxide film 4.

When the vanadium oxide film 4 is to be etched by the ion milling, the first insulating film 3 cannot avoid to be etched together, because the underlying first insulating layer 3 has almost the same etching rate as an etching rate of the vanadium oxide film 4. As a result, as illustrated in FIG. 1, the wiring layers 2 formed below the first insulating layer 3 are damaged.

In addition, in the ion milling, thermions are radiated from an ion, milling apparatus in order to neutralize ions. As a result, a circuit formed in the semiconductor substrate 1 below the patterned vanadium oxide film 4 may accumulate much electric charges therein, which often causes breakdown of the circuit.

In the plasma-enhanced etching, breakdown of a circuit caused by accumulation of electric charges does not occur.

Though Buhey et al. have set forth that a mask to be formed on a vanadium oxide film when plasma-enhanced etching is to be carried out has to be composed of gold (Au), such a golden mask is accompanied with a problem as follows.

When the golden mask is removed, there has to be used an etchant containing iodine and potassium iodide. The use of such an etchant may vary characteristic of a vanadium oxide film after removal of the golden mask, or may cause a vanadium oxide film to be molten. In addition, it is impossible by existing technique to both increase an etching rate of a vanadium oxide film and enhance a ratio in an etching rate between a vanadium oxide film and an underlying insulating layer, that is, an etching selection ratio.

Hence, a portion of an underlying insulating layer located below an unmasked portion of a vanadium oxide film may be etched with the result that a thin portion of the insulating layer is formed with a hole, and resultingly, a wiring layer located below the hole is also etched.

SUMMARY OF THE INVENTION

In view of the above-mentioned treatments of a vanadium oxide film, there is a need in improvement in an etching rate of a vanadium oxide film, improvement in an etching selection ratio between a vanadium oxide film and an underlying insulating layer, and a mask used for keeping an underlying insulating layer unetched and composed of materials other than gold.

It is an object of the present invention to provide a method of carrying out plasma-enhanced etching of a vanadium oxide film which method is capable of enhancing an etching ratio of a vanadium oxide film to an underlying insulating layer.

In one aspect, there is provided a method of carrying out plasma-enhanced etching of a vanadium oxide film formed on an insulating layer, wherein there is used an etching gas containing a fluoride gas, which fluoride has fluorine (F) atoms by six or greater.

There is further provided a method of carrying out plasma-enhanced etching of a vanadium oxide film formed on an insulating layer, wherein there is used an etching gas containing a fluoride gas at a volume ratio of 10% or greater, which fluoride has fluorine (F) atoms by six or greater.

A fluoride gas may be selected from $SF_6$ gas, $C_2F_6$ gas and $C_3F_8$ gas, for instance.

The above-mentioned methods can enhance etching reactivity of a vanadium oxide film, and further enhance an etching ratio between a vanadium oxide film and an underlying insulating layer relative to the conventional methods. Accordingly, it is now possible to prevent the underlying insulating layer from being etched together, when the vanadium oxide film is etched.

For instance, the insulating layer may be composed of silicon nitride.

It is preferable that the etching gas is a mixture gas containing a fluoride gas and a carbon dioxide gas. This ensures that a vanadium oxide film has en etching rate equal to or greater than 200 nm/min.

There is still further provided a method of carrying out plasma-enhanced etching of a vanadium oxide film, including the steps of (a) depositing one of a resist film and an insulating film on a vanadium oxide film, (b) patterning the one of a resist film and an insulating film to thereby form a mask, and (c) carrying out plasma-enhanced etching of a vanadium oxide film through the use of an etching gas containing a fluoride gas, which fluoride has fluorine (F) atoms by six or greater.

There is still further provided a method of carrying out plasma-enhanced etching of a vanadium oxide film, including the steps of (a) depositing one of a resist film and an insulating film on a vanadium oxide film, (b) patterning the one of a resist film and an insulating film to thereby form a mask, and (c) carrying out plasma-enhanced etching of a vanadium oxide film through the use of an etching gas containing a fluoride gas at a volume ratio of 10% or greater, which fluoride has fluorine (F) atoms by six or greater.

The above-mentioned methods prevent the vanadium oxide film from being exposed to atmosphere, and hence, it would be possible to etch the vanadium oxide film without exerting a harmful influence on characteristic of the vanadium oxide film.

It is preferable that a flow rate of the etching gas in the step (c) is set equal to 100 sccm or greater.

An etching gas usually has a pressure in the range of 7 Pa to 12 Pa. By flowing the etching gas at 100 cc per minute or greater with an etching gas pressure being kept in the range of 7 Pa to 12 Pa, the etching gas stays in an etching chamber for a shorter period of time than before, resulting in facilitation in etching reaction.

It is preferable that the insulating film is deposited so as to have a thickness of 60 nm or smaller in the step (a).

For instance, the insulating film may be composed of silicon dioxide or silicon nitride.

It is preferable that the insulating film is patterned in the step (b) by plasma-enhanced etching through the use of a mixture gas containing a $CHF_3$ gas and an oxygen gas, in which case, the mixture gas preferably contains a $CHF_3$ gas at a volume ratio of 80% or greater.

The use of the above-mentioned mixture gas makes it possible to effectively stop etching of a vanadium oxide film located just below a mask at the time when the mask has been just patterned, in comparison with the conventional methods.

It is preferable that a flow rate of the mixture gas is set in the range of 20 to 30 cc/min.

In another aspect of the present invention, there is provided an etching gas used for carrying out plasma-enhanced etching of a vanadium oxide film formed on an insulating layer, the etching gas containing a fluoride gas, which fluoride has fluorine (F) atoms by six or greater.

There is further provided an etching gas used for carrying out plasma-enhanced etching of a vanadium oxide film formed on an insulating layer, the etching gas containing a fluoride gas at a volume ratio of 10% or greater, which fluoride has fluorine (F) atoms by six or greater.

It is preferable that the etching gas is a mixture gas containing a fluoride gas and a carbon dioxide gas.

The advantages obtained by the aforementioned present invention will be described hereinbelow.

In accordance with the present invention, there is used an etching gas containing a fluoride gas preferably at a volume ratio of 10% or greater, which fluoride has fluorine (F) atoms by six or greater, when a vanadium oxide film formed on an insulating layer is etched by plasma-enhanced etching.

As a result, it is possible to enhance an etching ratio between a vanadium oxide film and an underlying insulating layer in comparison with the conventional methods. Hence, even if a circuit is formed below the insulating layer, it is possible to prevent breakdown of the circuit caused by accumulation of electric charges therein from occurring. In addition, a wiring layer formed in an insulating layer is not etched. Furthermore, a vanadium oxide film can be properly etched.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
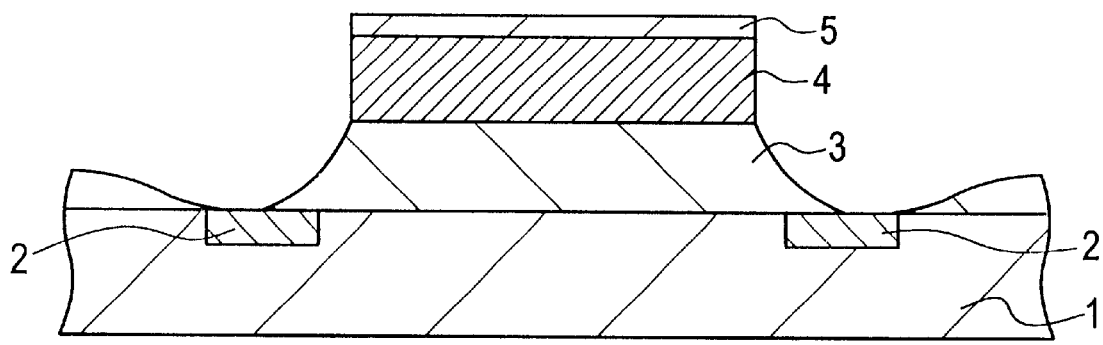
FIG. 1 is a cross-sectional view of a semiconductor device including a vanadium oxide film having been etched in accordance with a conventional method.
Figure 2:
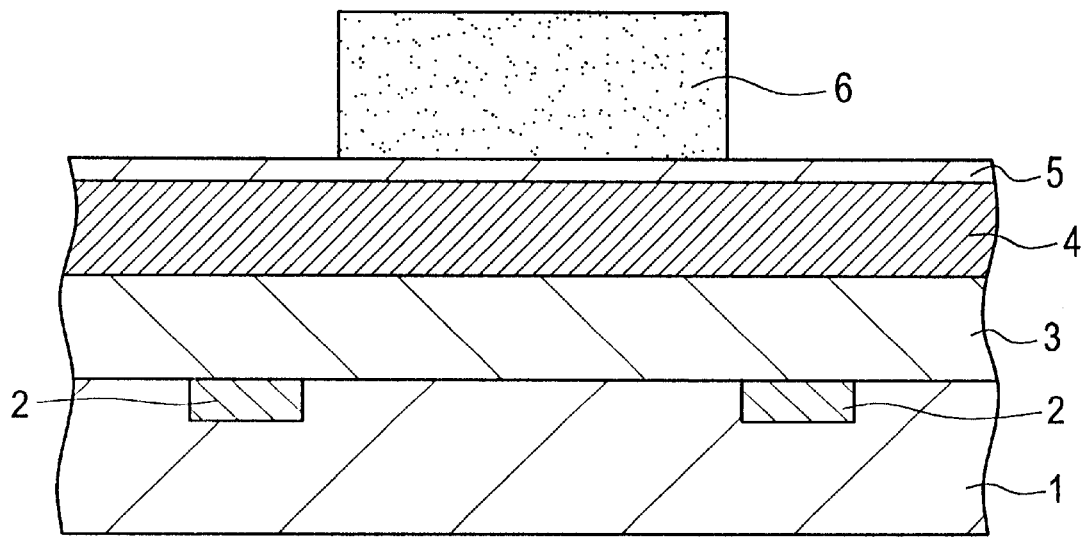
FIGS. 2 to 4 are cross-sectional views of a semiconductor device including a vanadium oxide film etched in accordance with a preferred. embodiment of the present invention.
Figure 3:
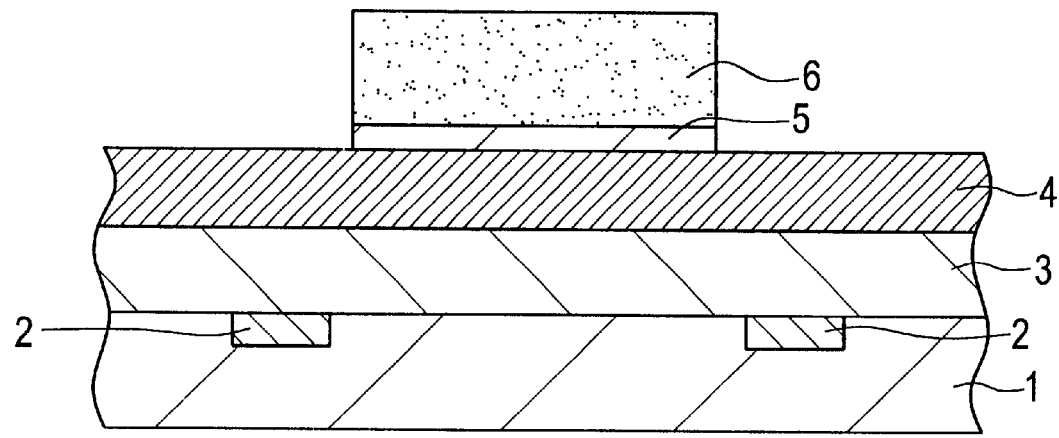
Figure 4:
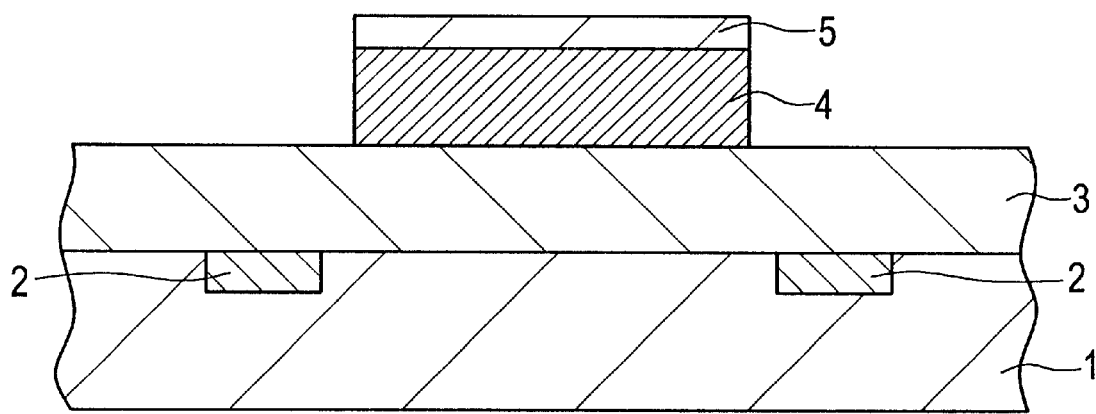

FIGS. 2 to 4 illustrates respective steps of a method of carrying out plasma-enhanced etching of a vanadium oxide film in accordance with a preferred embodiment of the present invention.

A substrate 1 is formed therein a circuit (not illustrated) acting as a sensor, and is formed at a surface thereof with wiring layers 2. First, as illustrated in FIG. 2, a first insulating layer 3 is formed on the substrate 1. The first insulating layer 3 is composed of SiNx, and has a thickness of 200 nm. The first insulating layer 3 may be composed of silicon dioxide ($SiO_2$).

Then, a vanadium oxide film 4 is formed on the first insulating layer 3 by a thickness of 150 nm by sputtering. The thus formed vanadium oxide film 4 is then subject to heat treatment.

Then, a second insulating layer 5 is formed on the vanadium oxide film 4 by a thickness of 58 nm by chemical vapor deposition (CVD). The second insulating layer 5 is composed of silicon dioxide ($SiO_2$).

Then, in order to make the second insulating layer 5 act as an etching stopper mask, a resist film 6 is formed on the second insulating layer 5, and then, is patterned.

Then, as illustrated in FIG. 3, the second insulating layer 5 is etched by plasma-enhanced etching with the patterned resist film 6 being used as a mask.

The conditions for carrying out plasma-enhanced etching are as follows.

Etching gases: $CHF_3$ and $O_2$
  Flow rate: 24 sccm
  Flow rate ratio: $CHF_3:O_2=83.5:16.5$
  Pressure: 10 Pa
  Power: 1200 W
  Etching time: 4 minutes FIG. 5 is a graph showing a relation between etching time and an etching depth in the first insulating film 3, the vanadium oxide film 4 and the second insulating film 5 having been etched by plasma-enhanced etching in the above-mentioned conditions.

Figure 5:
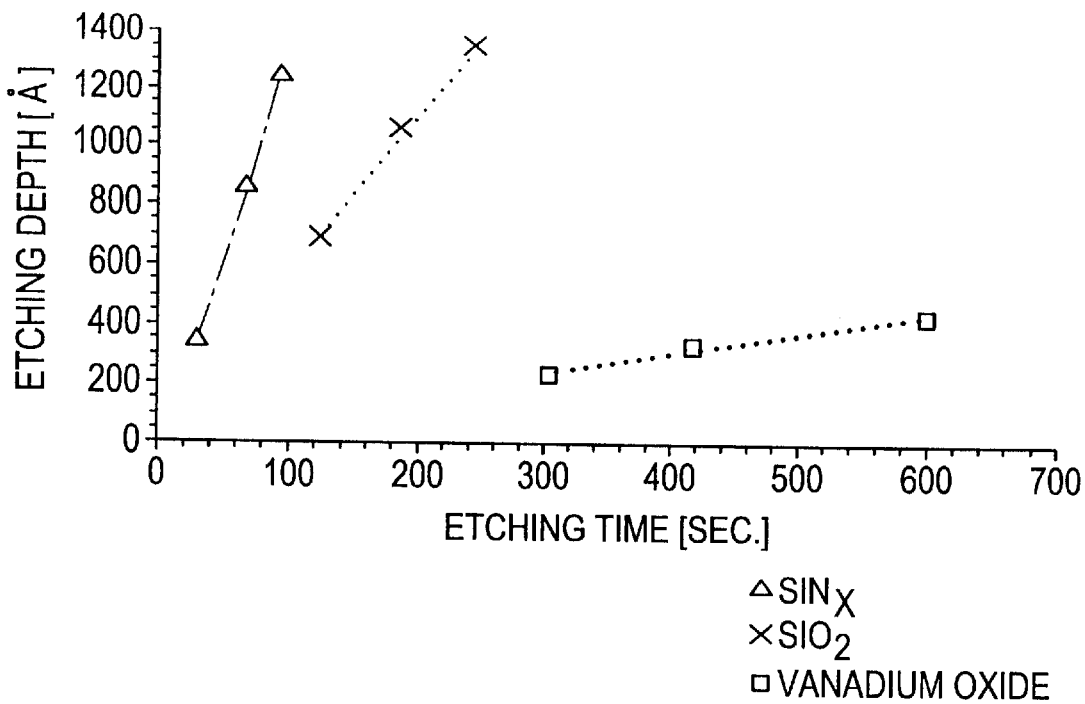
FIG. 5 is a graph showing a relation between etching time and anL etching depth in a $SiO_2$ film, a SiNx film and a vanadium oxide film etched by plasma-enhanced etching in an atmosphere of a mixture gas containing $CHF_3$ gas and $O_2$ gas.

In view of FIG. 5, it is understood that the first insulating film 3, the vanadium oxide film 4 and the second insulating film 5 have the following etching rates.

The vanadium oxide film 4: 4.4 [nm/min]
The first insulating film 3: 78.2 [nm/min]
The second insulating film 5: 34.5 [nm/min]

The following etching selection ratios are obtained based on the above-listed etching rates.

The vanadium oxide film/the first insulating film: 0.06
The vanadium oxide film/the second insulating film: 0.13
The second insulating film/the first insulating film: 0.44

It is understood in view of the above-listed etching selection ratios that since the ratio of the vanadium oxide film to the first insulating film and the ratio of the vanadium oxide film to the second insulating film are both smaller than 0.2, the vanadium oxide film 4 is scarcely etched, even if the second insulating layer 5 is etched, and resultingly, the vanadium oxide film 4 is exposed to atmosphere.

Referring back to FIG. 3, the etching gas is changed to a mixture gas containing $SF_6$ and $CO_2$ gases. Then, as illustrated in FIG. 4, the vanadium oxide film 4 is etched through the use of the mixture gas in the following conditions with the patterned second insulating layer 5 being used as a mask.

Flow rate: 174 sccm
    Flow rate ratio: $SF_6:CO_2=15:85$
    Pressure: 7 Pa
    Power: 500 W (power density=0.13 W/cm$^2$)
Etching time: 40 seconds FIG. 4 illustrates the vanadium oxide film 4 having been etched.]

Figure 6:
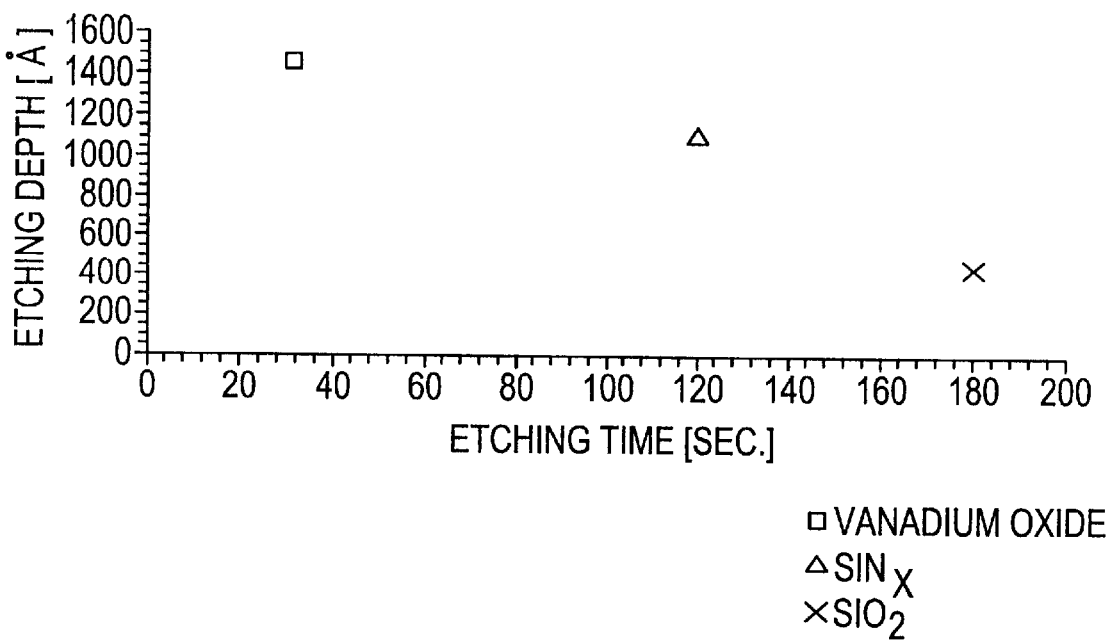
FIG. 6 is a graph showing a relation between etching time and an etching depth in a $SiO_2$ film, a SiNx film and a vanadium oxide film etched by plasma-enhanced etching in an atmosphere of a mixture gas containing $SF_6$ gas and $CO_2$ gas.

FIG. 6 is a graph showing a relation between etching time and an etching depth in the first insulating film 3, the vanadium oxide film 4 and the second insulating film 5 etched by plasma-enhanced etching under the above-mentioned conditions.

In view of FIG. 6, it is understood that the first insulating film 3, the vanadium oxide film 4 and the second insulating film 5 have the following etching rates.

The vanadium oxide film 4: 292.2 [nm/min]
The first insulating film 3: 56.4 [nm/min]
The second insulating film 5: 14.9 [nm/min]

The following etching selection ratios are obtained based on the above-listed etching rates.

The vanadium oxide film/the first insulating film: 5.2
The vanadium oxide film/the second insulating film: 19.6
The second insulating film/the first insulating film: 0.3

If the etching gas is supplied at a flow rate of 100 sccm or greater, the vanadium oxide film 4 would have an etching rate of 200 nm/min or greater, and an etching selection ratio between he vanadium oxide film and the first insulating film is equal to or greater than 5. Hence, when the etching of the vanadium oxide film 4 has just been completed, the etching can be made stop without etching the underlying first insulating layer 3.

In addition, since the second insulating layer 5 used as a mask is scarcely etched, the second insulating layer 5 can act as an etching stopper.

Furthermore, the etching gas flow rate in the instant embodiment is smaller than an etching gas flow rate in a conventional method.

In order to act as a mask, the second insulating layer 5 is designed to have a thickness of 60 nm or smaller. The etching gas used for plasma-etching the second insulating layer 5 is preferably a gas containing $CHF_3$ gas at a volume ratio of 80% or greater. It is also preferable that such a gas is fed into an etching chamber at a flow rate of 20 to 30 cc/min.

In the instant embodiment, an etching rate of the resist film 6 is 153 nm/min. Since the resist film 6 is usually designed to have a thickness of 1000 nm or greater, it is possible to use the resist film 6 as a mask to prevent the vanadium oxide film 4 from being etched.

Hereinbelow is explained an experimental example in which the inventor had actually etched the vanadium oxide film 4.

In the example, the mixture gas containing $CF_4$ and $CO_2$ gases was used as an etching gas. The vanadium oxide film 4 was etched through the use of the mixture gas, and an etching rate of the vanadium oxide film 4 was measured. The result was as follows.

The vanadium oxide film 4: 29.2 [nm/min]
The first insulating film 3: 33.8 [nm/min]
The second insulating film 5: 22.6 [nm/min]
Flow rate: 100 [cc/min] or greater The vanadium oxide film 4 had an etching rate of 29.2 nm/min, which means that it was not possible to obtain a sufficiently great etching rate of the vanadium oxide film 4.

As is obvious from comparison between the above-mentioned embodiment wherein the etching gas contains $SF_6$ gas and the experimental example wherein the etching gas contains $CF_4$ gas, a fluoride gas to be used for etching a vanadium oxide film together with $CO_2$ gas has to include fluorine (F) atoms by six or greater.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-135053 filed on May 18, 1998 including specification, claims, drawings and summary is incorporated herein by reference in its entirety.

What is claimed is:

1. A method of carrying out plasma-enhanced etching of a vanadium oxide film formed on an insulating layer, comprising etching with an etching gas containing a fluoride gas, which fluoride has fluorine (F) atoms therein of greater than six, of a vanadium oxide film formed on an insulating layer.

2. A method of carrying out plasma-enhanced etching of a vanadium oxide film formed on an insulating layer, comprising etching with an etching gas containing a fluoride gas at a volume ratio of 10% or greater, which fluoride has fluorine (F) atoms of greater than six, of a vanadium oxide film formed on an insulating layer.

3. The method as set forth in claim 2, wherein said insulating layer is composed of silicon nitride.

4. The method as set forth in claim 2, wherein said etching gas is a mixture gas containing a fluoride gas and a carbon dioxide gas.

5. A method of carrying out plasma-enhanced etching of a vanadium oxide film, comprising the steps of
    (a) depositing one of a resist film and an insulating film on a vanadium oxide film;
    (b) patterning said one of a resist film and an insulating film to thereby form a mask; and
    (c) carrying out plasma-enhanced etching of a vanadium oxide film through the use of an etching gas containing a fluoride gas, which fluoride has fluorine (F) atoms of greater than six.

6. A method of carrying out plasma-enhanced etching of a vanadium oxide film, comprising the steps of (a) depositing one of a resist film and an insulating film on a vanadium oxide film;

(b) patterning said one of a resist film and an insulating film to thereby form a mask; and (c) carrying out plasma-enhanced etching of a vanadium oxide film through the use of an etching gas containing a fluoride gas at a volume ratio of 10% or greater, which fluoride has fluorine (F) atoms of greater than six.

7. The method as set forth in claim 6, wherein said insulating film is composed of silicon dioxide or silicon nitride.

8. The method as set forth in claim 7, wherein said insulating film is patterned in said step (b) by plasma-enhanced etching through the use of a mixture gas containing a $CHF_3$ gas and an oxygen gas.

9. The method as set forth in claim 8, wherein said mixture gas contains a $CHF_3$ gas at a volume ratio of 80% or greater.

10. The method as set forth in claim 9, wherein a flow rate of said mixture gas is set in the range of 20 to 30 cc/min.

11. The method as set forth in claim 6, wherein a flow rate of said etching gas in said step (c) is set equal to 100 sccm or greater.

12. The method as set forth in claim 6, wherein said insulating film is deposited so as to have a thickness of 60 nm or smaller in said step (a).

* * * * *